United States Patent
R et al.

(10) Patent No.: US 11,907,588 B2
(45) Date of Patent: Feb. 20, 2024

(54) ACCELERATE MEMORY DECOMPRESSION OF A LARGE PHYSICALLY SCATTERED BUFFER ON A MULTI-SOCKET SYMMETRIC MULTIPROCESSING ARCHITECTURE

(71) Applicant: International Business Machines Corporation, Armonk, NY (US)

(72) Inventors: Vishnupriya R, Kochi (IN); Mehulkumar J. Patel, Bangalore (IN); Manish Mukul, Bengaluru (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/526,016

(22) Filed: Nov. 15, 2021

(65) Prior Publication Data

US 2023/0153034 A1   May 18, 2023

(51) Int. Cl.
*G06F 3/06* (2006.01)
*G06F 12/10* (2016.01)
*H03M 7/40* (2006.01)

(52) U.S. Cl.
CPC .......... *G06F 3/0661* (2013.01); *G06F 3/0608* (2013.01); *G06F 3/0673* (2013.01); *G06F 12/10* (2013.01); *G06F 2212/1044* (2013.01); *H03M 7/40* (2013.01)

(58) Field of Classification Search
CPC .............. G06F 12/1009; G06F 12/109; G06F 12/1072; G06F 3/0673; G06F 3/0661; G06F 3/0608; G06F 12/10

USPC .................................. 711/154, E12.001, 100
See application file for complete search history.

(56) References Cited

U.S. PATENT DOCUMENTS

| | | | | |
|---|---|---|---|---|
| 5,574,953 | A * | 11/1996 | Rust ..................... | G06F 12/0223 711/171 |
| 5,870,535 | A * | 2/1999 | Duffin ..................... | G06K 15/02 358/1.16 |
| 10,958,732 | B1 * | 3/2021 | Procopio ................. | H04L 67/10 |
| 2010/0013678 | A1 * | 1/2010 | Biran .................. | H03M 7/3086 341/55 |
| 2010/0250864 | A1 * | 9/2010 | Carty ...................... | G06F 9/445 711/170 |
| 2012/0212498 | A1 * | 8/2012 | Dye ......................... | G09G 5/39 711/E12.001 |
| 2018/0248562 | A1 * | 8/2018 | Redfern .................. | G06F 17/16 |

(Continued)

*Primary Examiner* — Yaima Rigol
*Assistant Examiner* — Edward Waddy, Jr.
(74) *Attorney, Agent, or Firm* — CANTOR COLBURN LLP; Teddi Maranzano

(57) ABSTRACT

Aspects of the invention include identifying a first subsystem and a second subsystem of a plurality of subsystems respectively storing a first compressed data and a second compressed data, wherein the first compressed data and the second compressed data are fragments of a requested data. A compression method used to compress the first compressed data and second compressed data is identified. A first accelerator of first subsystem and a second accelerator of the second subsystem is identified. The first compressed data from a first local memory of the first subsystem is offloaded to the first accelerator, and the second compressed data from a second local memory of the second subsystem is offloaded to the second accelerator, wherein offloading comprises provided a decompression method for the first compressed data and the second compressed data.

20 Claims, 4 Drawing Sheets

(56) References Cited

U.S. PATENT DOCUMENTS

| | | |
|---|---|---|
| 2018/0329830 A1* | 11/2018 | Senior ................. G06F 12/1036 |
| 2021/0141535 A1 | 5/2021 | R et al. |
| 2022/0231698 A1* | 7/2022 | Salamat ................ G06F 3/0673 |
| 2023/0100586 A1* | 3/2023 | Kakaiya ................ G06F 9/4881 |
| | | 717/102 |

* cited by examiner

ACCELERATE MEMORY DECOMPRESSION OF A LARGE PHYSICALLY SCATTERED BUFFER ON A MULTI-SOCKET SYMMETRIC MULTIPROCESSING ARCHITECTURE

BACKGROUND

The present invention generally relates to programmable computing systems, and more specifically, to programmable computing systems configured to accelerate memory decompression of large physically scattered buffer on a multi-socket symmetric multiprocessing architecture.

Signal processing is the manipulation of digital signals within a computer system. As part of signal processing, data is compressed by encoding data to use fewer bits than an original state of the data. The compressed data is decompressed by decoding the data to return the data to its original state. The more complex a data compression algorithm is, the greater the number of clock cycles are needed to complete the compression and decompression. The latency of applications requesting information is based in part of a number of clock cycles necessary to perform the compressing and decompressing of requested data.

SUMMARY

Embodiments of the present invention are directed to a computer-implemented method for accelerating memory decompression of large physically scattered buffer on a multi-socket symmetric multiprocessing architecture. A non-limiting example of the computer-implemented method includes identifying a first subsystem and a second subsystem of a plurality of subsystems respectively storing a first compressed data and a second compressed data, wherein the first compressed data and the second compressed data are fragments of a requested data. A compression method used to compress the first compressed data and second compressed data is identified. A first accelerator of the first subsystem and a second accelerator of the second subsystem are identified. The first compressed data from a first local memory of the first subsystem is offloaded to the first accelerator, and the second compressed data from a second local memory of the second subsystem is offloaded to the second accelerator, wherein offloading comprises provided a decompression method for the first compressed data and the second compressed data.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide computer-implemented methods, computer systems, and computer program products that offloads scattered fragments of data from a memory buffer of a central processing unit to respective local accelerators to speed up decompression. The scattered data is offloaded to a hardware accelerator based on the physical proximity to the scattered data, which accelerates the decompression process.

Database management systems use decompression algorithms that expand a compressed version of a file back to the original size of the file. In the instance that data from a compressed file is requested, a database management system assigns the compressed file to a processor to perform the decompression. The database management system selects the processor on a first-come, first-serve basis. This assignment method does not account for the physical layout of the database or processor and results in a longer than necessary time to perform the decompression.

One or more embodiments of the present invention address one or more of the above-described shortcomings by providing computer-implemented methods, computer systems, and computer program products that determine where a physical block of compressed data is scattered in a memory buffer. For each identified fragment of compressed data, an accelerator having the closest physical proximity is identified, and the fragment of compressed data is assigned to said accelerator. Each fragment of data is analyzed to determine a method of compressing the data. Based on the method of compression, the system software selects the decompression method. By leveraging the physical proximity of the accelerator to the fragment of compressed data, the herein described embodiments save clock cycles required to get the data to the processor and reduce the time required to complete the decompression.

Figure 1:
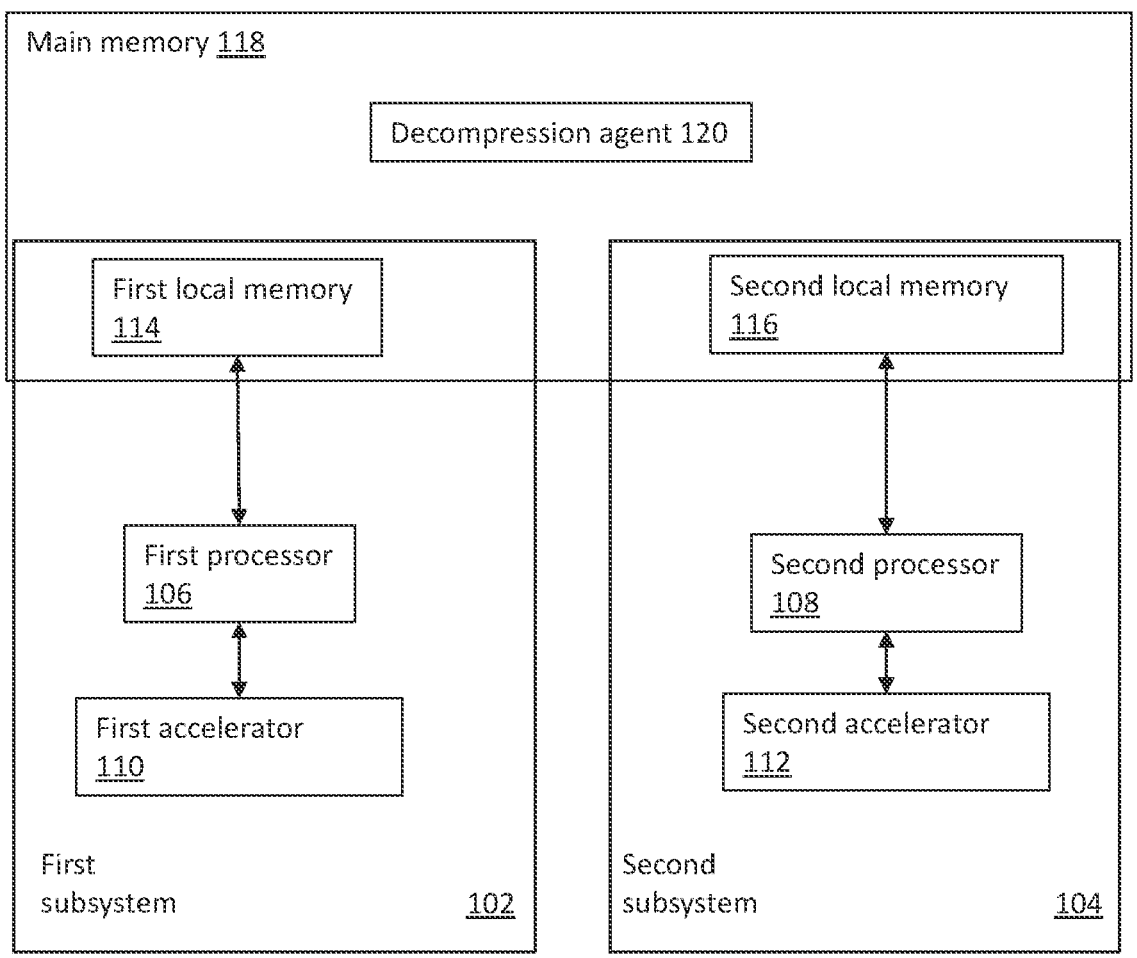
FIG. 1 illustrates a system for accelerating memory decompression of large physically scattered buffer on a multi-socket symmetric multiprocessing architecture in accordance with one or more embodiments of the present invention.

Referring to FIG. 1, a symmetric multiprocessing system 100, hereinafter the system 100, for accelerating memory decompression of a large physically scattered buffer is shown in accordance with one or more embodiments of the present invention. A symmetric multiprocessing system is a computer system that includes two or more processors that share a common memory and data path. A single operating system (not shown) controls each processor of the system 100.

As described herein, the system 100 includes a first subsystem 102 and a second subsystem 104. The first subsystem 102 includes a first processor 106 referred to as a first socket. The second subsystem 104 includes a second processor 108 referred to as a second socket. Each of the first processor 106 and the second processor 108 is connected to a first accelerator 110 and a second accelerator 112, respectively. Each accelerator is specialized hardware designed to receive offloaded data from the symmetric multiprocessing system and perform the decompression. Additionally, each of the first processor 106 and the second processor 108 have access to a first local memory 114 and a second local memory 118 located in main memory 118. In some embodiments of the present invention, each the first local memory 114 and the second local memory 118 are a cache memory. When an application requests memory, the single operating system may provide the application a buffer that includes a range of virtual addresses corresponding to physical address spaces distributed across the first local memory 114 and the second local memory 118 of the first subsystem 102 and the second subsystem 104. It should be appreciated that although two subsystems are illustrated, the system 100 could include any number of subsystems greater than one.

A decompression agent 120 receives a read memory request from an application. The decompression agent 120 is a software algorithm for decompressing a block of data using various decompression algorithms. Based on the read memory request, the decompression agent 120 identifies the virtual addresses of the requested data. The virtual addresses include a virtual page number and offsets within the page. The decompression agent 120 translates the virtual page numbers and offsets into physical addresses of the requested data. The physical address enables the decompression agent 120 to determine where the fragments that make up the requested data are located in the first local memory 114 or the second local memory 118. In addition to determining the physical address of the requested data, the decompression agent 120 can read the data stored at the physical address and determine that the data is compressed, including an algorithm used to compress the data, as well as the boundaries of the data. The decompression agent 120 further determines a compression method used to compress the requested data. In some instances, the requested data includes a file extension that identifies the compression method. In some instances, decompression agent 120 determines the compression method based on the nature of the compressed data. The decompression agent 120 compares the state of the bits to states of compressed bits from dictionaries associated with different compression methods. For example, by analyzing a state of the bits of a fragment, the decompression agent 120 determines the compression method. In some instances, the decompression agent 120 retrieves an initial set of bits from a fragment of the requested data. The initial set of bits being fewer than the total number of bits in the fragment of the requested data. Based on a state of the initial set of bits, the decompression agent 120 identifies one or more potential compression methods used to compress the requested data. The decompression agent 120 then selects decompression algorithms from a decompression library based on the one or more potential compression algorithms. The decompression agent 120 then decompresses the initial set of bits to verify which compression algorithm was used to compress the requested data. Once the compression method is identified, the decompression agent 120 accesses a table to determine which decompression method to use. As data that is stored as fragments across a memory buffer will have been compressed using the same method, the decompression agent 120 associates the compression method with each fragment of the requested data. The boundaries enable the decompression agent 120 to recognize where each parameter of the requested data begins and where the parameter ends. The boundaries include the boundaries as utilized by the decompression agent 120, but also additional boundaries as defined by the compression algorithm used to compress the data as well. The boundaries used by the compression algorithm enable a multi-block decompression algorithm to process the data and decompress multiple blocks in parallel.

The decompression agent 120 then offloads the fragments of compressed data from the first local memory 114 and second local memory 118, including an identity of the compression algorithm, to the respective first accelerator 110 or second accelerator 112 for decompression. For example, if a fragment of data is located in the first local memory, the decompression agent 120 offloads the fragment to the first accelerator 110, and not the second accelerator 112. The decompression algorithm is based on the identity of the compression algorithm. The first accelerator 110 and the second accelerator 112 are operable to use various decompression algorithms to decompress the compressed data. For example, the first accelerator 110 and the second accelerator 112 can execute a fixed Huffman table (FHT) algorithm to decompress the compressed data. This method uses a predefined universal dictionary (FHT) decompressing the data and permits parallel decompression by the decompression units of the first accelerator 110 and the second accelerator 112. The first accelerator 110 and the second accelerator 112 are also operable to use a dynamic Huffman table (DHT) with full flush mode. Each of the first accelerator 110 and the second accelerator 112 include two or more decompression units that can decompress data independently and in parallel to each other for above mentioned compression methods. The first accelerator 110 and the second accelerator 112 are also operable to use a dynamic Huffman table (DHT) without full flush mode. The method uses a data-defined dictionary (DHT) based on the input data used during compression. The DHT has code and back-reference information (also called history data), which is used during decompression. This method does not permit parallel decompression by the decompression units of the first accelerator 110 and the second accelerator 112, and parallel decompression by the different accelerators.

Figure 2:
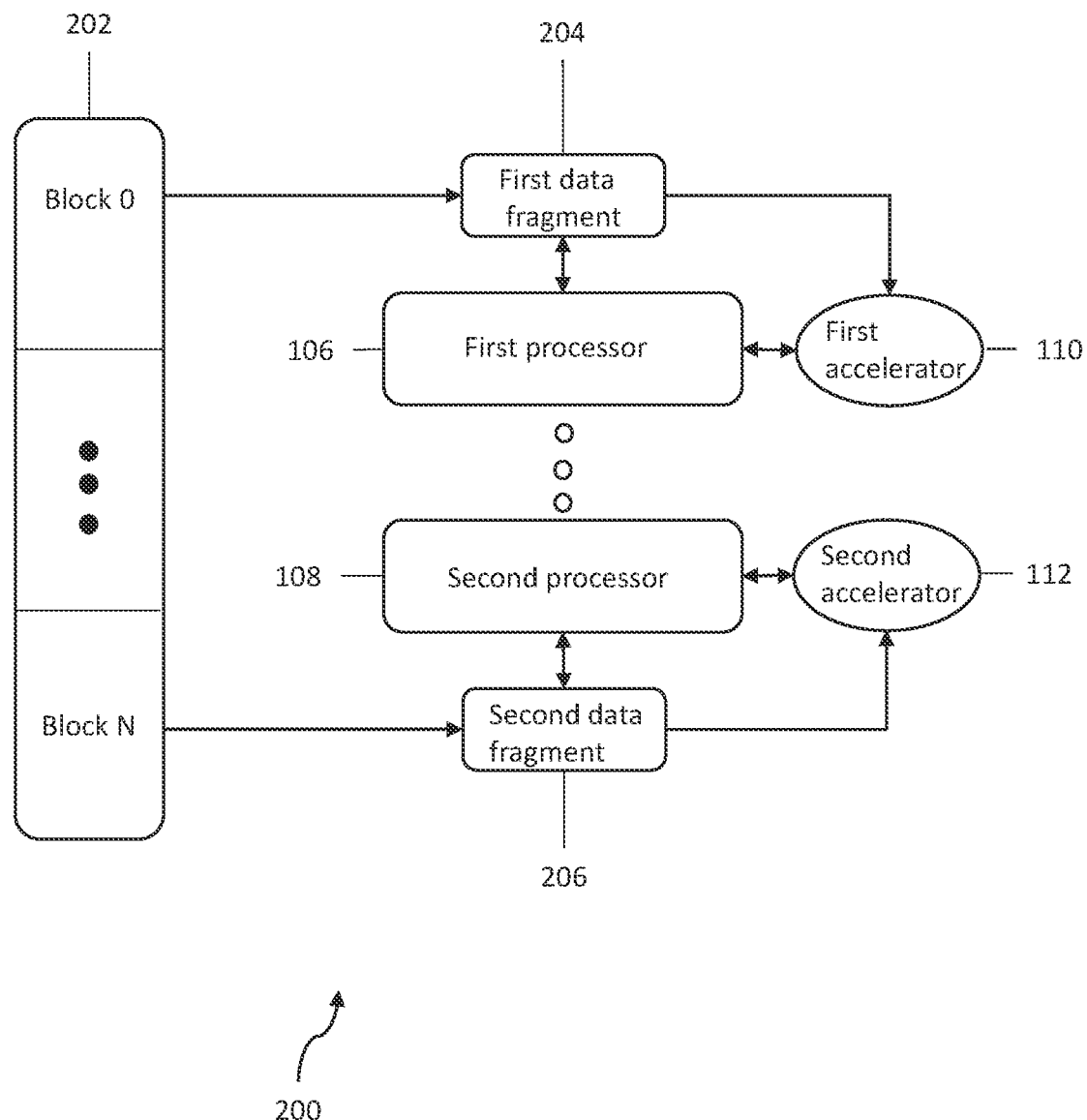
FIG. 2 illustrates a first socket and a second socket of a printed circuit board in communication with a memory buffer and two accelerators in accordance with one or more embodiments of the present invention.

Referring to FIG. 2, an illustration of a decompression process 200 is shown in accordance with one or more embodiments of the present invention. As illustrated, a memory buffer 202 holds virtual addresses for block 0 to data block N of data. As illustrated, an application has requested data, in which a first data fragment 204 of the requested data is stored in the first local memory 114 of a first subsystem 102 and a second data fragment 206 is stored in the second local memory 118 of a second subsystem 104. The first data fragment 204 is offloaded to a first accelerator 110 via a first processor 106. Additionally, the second data fragment 206 is offloaded to a second accelerator 112 via a second processor 108. As illustrated, the second data fragment 206 is stored in the local memory of a separate subsystem than the first data fragment 204. Blocks 0-N are not stored in a physically contiguous location, and are scattered throughout the memory buffer 202. In other words, blocks 0-N are not all held in sequential memory addresses and can be separated by unrelated data pages.

The first processor 106 and the second processor 108 are each operable to perform direct memory access (DMA) between the two above referenced processor subsystems. The first processor 106 and the second processor 108 can execute a local direct memory access first processor 106 and the second processor 108 and instruct the local memory of the processor subsystems to respectively send the first data fragment 204 and the second data fragment 216 directly to the first accelerator 210 and the second accelerator 212. In other words, a decompression agent 120 restricts the decompression operations to accelerators that are local to the local memory of each subsystem. This local DMA results in lower latency than if the decompression agent 120 instructed a local memory to transmit a data fragment to a remote accelerator.

Figure 3:
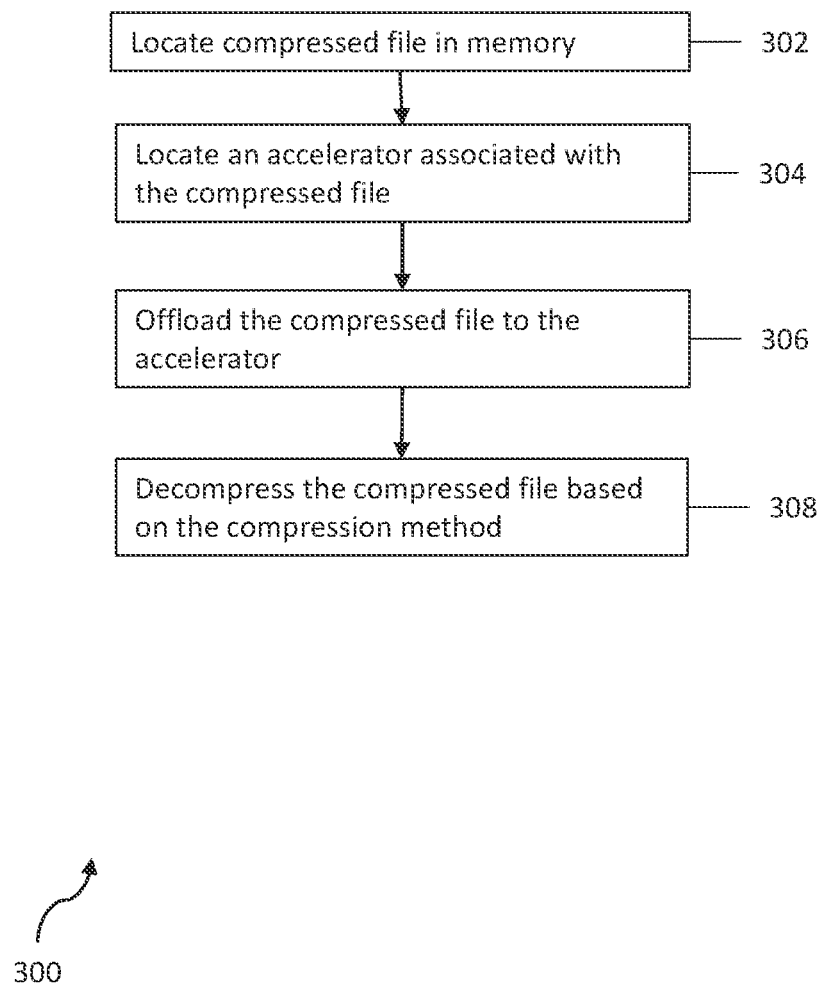
FIG. 3 illustrates a process flow for accelerating memory decompression of large physically scattered buffer on a multi-socket symmetric multiprocessing architecture in accordance with one or more embodiments of the present invention.
Figure 4:
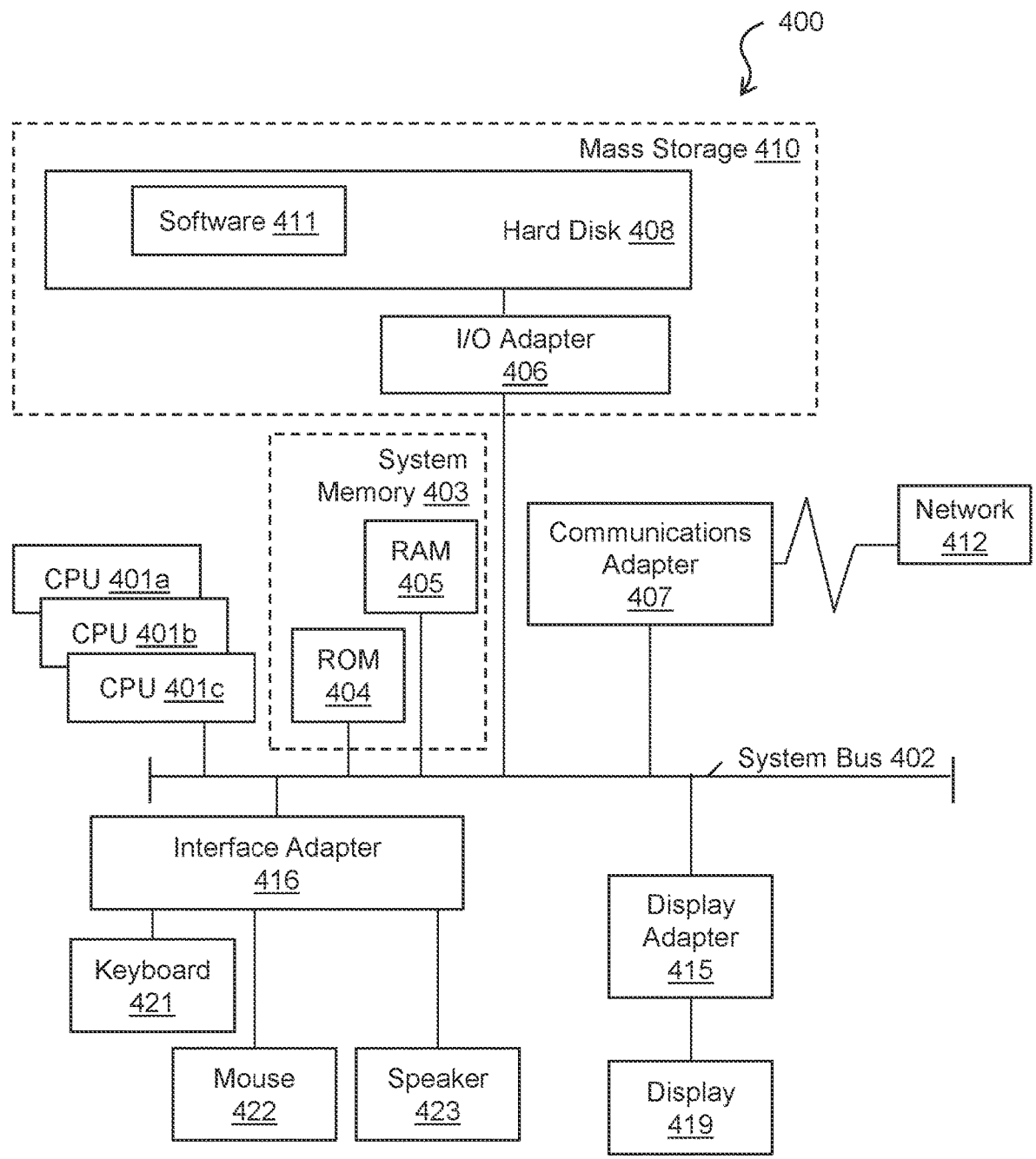
FIG. 4 illustrates a block diagram of a computer system for use in implementing one or more embodiments of the present invention.

Referring to FIG. 3, a process 300 for accelerating memory decompression of a large physically scattered buffer on a multi-socket symmetric multiprocessing architecture. It should be appreciated that all or a portion of the process can be performed on a computer system 400 as illustrated in FIG. 4. At block 302, decompression agent 120 locates a first requested data in a first local memory 114 of a first subsystem 102 of a symmetric multiprocessing system. The decompression agent 120 further locates a second requested data in a second local memory 116 of a second subsystem 104 of a symmetric multiprocessing system. In some embodiments of the present invention, the decompression agent 120 receives a read memory request and identifies a virtual addresses of the requested data. The decompression agent 120 translates the virtual addresses into physical addresses of the requested data. The decompression agent 120 further determines that the requested data comprises the first requested data and the second requested data. In addition, the decompression agent 120 can read the data stored at the physical address and determine that the data is compressed, including an algorithm used to compress the data, as well as the boundaries of the data.

At block 304, the decompression agent 120 identifies a first accelerator 110 and the second accelerator 112 based on the first local memory 114 and the first accelerator being a part of a first subsystem 102; and the second local memory 118 and the second accelerator 112 being a part of a second subsystem 104.

At block 306, the decompression agent 120 retrieves the compressed data from the first local memory 114 and second local memory 118; and offloads the data to the first accelerator 110 and the second accelerator 112. The decompression agent 120 further provides the compression method used to compress the data, and further instructs the first accelerator 110 and the second accelerator 112 on which decompression method to use.

In one or more embodiments of the present invention, the hardware/software modules in the system 100 from FIG. 1 can be implemented on the processing system 400 found in FIG. 4. Turning now to FIG. 4, a computer system 400 is generally shown in accordance with an embodiment. The computer system 400 can be an electronic, computer framework comprising and/or employing any number and combination of computing devices and networks utilizing various communication technologies, as described herein. The computer system 400 can be easily scalable, extensible, and modular, with the ability to change to different services or reconfigure some features independently of others. The computer system 400 may be, for example, a server, desktop computer, laptop computer, tablet computer, or smartphone. Computer system 400 may be described in the general context of computer system executable instructions, such as program modules, being executed by a computer system. Generally, program modules may include routines, programs, objects, components, logic, data structures, and so on that perform particular tasks or implement particular abstract data types. Computer system 400 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, the computer system 400 has one or more central processing units (CPU(s)) 401a, 401b, 401c, etc. (collectively or generically referred to as processor(s) 401). The processors 401 can be a single-core processor, multi-core processor, computing cluster, or any number of other configurations. The processors 401, also referred to as processing circuits, are coupled via a system bus 402 to a system memory 403 and various other components. The system memory 403 can include a read only memory (ROM) 404 and a random access memory (RAM) 405. The ROM 404 is coupled to the system bus 402 and may include a basic input/output system (BIOS), which controls certain basic functions of the computer system 400. The RAM is read-write memory coupled to the system bus 402 for use by the processors 401. The system memory 403 provides temporary memory space for operations of said instructions during operation. The system memory 403 can include random access memory (RAM), read only memory, flash memory, or any other suitable memory systems.

The computer system 400 comprises an input/output (I/O) adapter 406 and a communications adapter 407 coupled to the system bus 402. The I/O adapter 406 may be a small computer system interface (SCSI) adapter that communicates with a hard disk 408 and/or any other similar component. The I/O adapter 406 and the hard disk 408 are collectively referred to herein as a mass storage 410.

Software 411 for execution on the computer system 400 may be stored in the mass storage 410. The mass storage 410 is an example of a tangible storage medium readable by the processors 401, where the software 411 is stored as instructions for execution by the processors 401 to cause the computer system 400 to operate, such as is described herein below with respect to the various Figures. Examples of computer program product and the execution of such instruction is discussed herein in more detail. The communications adapter 407 interconnects the system bus 402 with a network 412, which may be an outside network, enabling the computer system 400 to communicate with other such systems. In one embodiment, a portion of the system memory 403 and the mass storage 410 collectively store an operating system, which may be any appropriate operating system, such as the z/OS, Linux, or AIX operating system from IBM Corporation, to coordinate the functions of the various components shown in FIG. 4.

Additional input/output devices are shown as connected to the system bus 502 via a display adapter 415 and an interface adapter 416 and. In one embodiment, the adapters 406, 407, 415, and 416 may be connected to one or more I/O buses that are connected to the system bus 402 via an intermediate bus bridge (not shown). A display 419 (e.g., a screen or a display monitor) is connected to the system bus 402 by a display adapter 415, which may include a graphics controller to improve the performance of graphics intensive applications and a video controller. A keyboard 421, a mouse 422, a speaker 423, etc. can be interconnected to the system bus 402 via the interface adapter 416, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 4, the computer system 400 includes processing capability in the form of the processors 401, and, storage capability including the system memory 403 and the mass storage 410, input means such as the keyboard 421 and the mouse 422, and output capability including the speaker 423 and the display 419.

In some embodiments, the communications adapter 407 can transmit data using any suitable interface or protocol, such as the internet small computer system interface, among others. The network 412 may be a cellular network, a radio network, a wide area network (WAN), a local area network (LAN), or the Internet, among others. An external computing device may connect to the computer system 400 through the network 412. In some examples, an external computing device may be an external webserver or a cloud computing node.

It is to be understood that the block diagram of FIG. 4 is not intended to indicate that the computer system 400 is to include all of the components shown in FIG. 4. Rather, the computer system 400 can include any appropriate fewer or additional components not illustrated in FIG. 4 (e.g., additional memory components, embedded controllers, modules, additional network interfaces, etc.). Further, the embodiments described herein with respect to computer system 400 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one"

and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
receiving, by a processor, a request for scattered data from a compressed file;
identifying, by a processor, a first subsystem and a second subsystem of a plurality of subsystems respectively storing, in a respective first physical block and second physical block, a first compressed data and a second compressed data, wherein the first compressed data and the second compressed data are fragments of the requested scattered data, and wherein the first physical block and the second physical block are noncontiguous blocks separated by unrelated data pages;
identifying, by the processor, a compression method used to compress the first compressed data and the second compressed data;
identifying, by the processor, a first accelerator of the first subsystem having a closest physical proximity to the first physical block and a second accelerator of the second subsystem having a closest physical proximity to the second physical block; and
offloading, by the processor, the first compressed data to the first accelerator, and the second compressed data to the second accelerator, wherein offloading comprises providing a decompression method for the first compressed data and the second compressed data based on the compression method.

2. The computer-implemented method of claim 1, wherein the method further comprises decompressing the first compressed data and the second compressed data using the identified compression method.

3. The computer-implemented method of claim 1, wherein the method further comprises:
receiving a read memory request for the first compressed data, wherein the read memory request includes a virtual address of the of the first compressed data; and
translating the virtual memory address to the physical location of the first compressed data.

4. The computer-implemented method of claim 1, wherein identifying the method of compressing the first compressed data comprises reading a file extension associated with the first compressed data.

5. The computer-implemented method of claim 4, wherein the method further comprises associating the method of compressing the first compressed data with the second compressed data.

6. The computer-implemented method of claim 1, wherein the method further comprises decompressing the first compressed data in parallel with the second compressed data.

7. The computer-implemented method of claim 1, wherein the first accelerator decompresses the compressed data using one of the following methods: fixed Huffman table decoding, and dynamic Huffman table decoding with full flush mode.

8. A system comprising:
a memory having computer readable instructions; and
one or more processors for executing the computer readable instructions, the computer readable instructions controlling the one or more processors to perform operations comprising:
receiving a request for scattered data from a compressed file;
identifying a first subsystem and a second subsystem of a plurality of subsystems respectively storing, in a respective first physical block and second physical block, a first compressed data and a second compressed data, wherein the first compressed data and the second compressed data are fragments of the requested scattered data, and wherein the first physical block and the second physical block are noncontiguous blocks separated by unrelated data pages;
identifying a compression method used to compress the first compressed data and the second compressed data;
identifying a first accelerator of the first subsystem having a closest physical proximity to the first physical block and a second accelerator of the second subsystem having a closest physical proximity to the second physical block; and
offloading the first compressed data to the first accelerator, and the second compressed data to the second accelerator, wherein offloading comprises providing a decompression method for the first compressed data and the second compressed data based on the compression method.

9. The system of claim 8, wherein the operations further comprise decompressing the first compressed data and the second compressed data using the identified compression method.

10. The system of claim 8, wherein the operations further comprise:
receiving a read memory request for the first compressed data, wherein the read memory request includes a virtual address of the of the first compressed data; and
translating the virtual memory address to a physical memory address of the first compressed data.

11. The system of claim 8, wherein identifying the method of compressing the first compressed data comprises reading a file extension associated with the first compressed data.

12. The system of claim 11, wherein the operations further comprise associating the method of compressing the first compressed data with the second compressed data.

13. The system of claim 8, wherein the operations further comprise decompressing the first compressed data in parallel with the second compressed data.

14. The system of claim 8, wherein the first accelerator decompresses the compressed data using one of the following methods: fixed Huffman table decoding, and dynamic Huffman table decoding with full flush mode.

15. A computer program product comprising a computer readable storage medium having program instructions embodied therewith, the program instructions executable by a processor to cause the processor to perform operations comprising:

receiving a request for scattered data from a compressed file;

identifying a first subsystem and a second subsystem of a plurality of subsystems respectively storing, in a respective first physical block and second physical block, a first compressed data and a second compressed data, wherein the first compressed data and the second compressed data are fragments of the requested scattered data, and wherein the first physical block and the second physical block are noncontiguous blocks separated by unrelated data pages;

identifying a compression method used to compress the first compressed data and the second compressed data;

identifying a first accelerator of the first subsystem having a closest physical proximity to the first physical block and a second accelerator of the second subsystem having a closest physical proximity to the second physical block; and offloading the first compressed data to the first accelerator, and the second compressed data to the second accelerator, wherein offloading comprises providing a decompression method for the first compressed data and the second compressed data based on the compression method.

16. The computer program product of claim 15, wherein the operations further comprise decompressing the first compressed data and the second compressed data using the identified compression method.

17. The computer program product of claim 15, wherein the operations further comprise:

receiving a read memory request for the first compressed data, wherein the read memory request includes a virtual address of the of the first compressed data; and translating the virtual memory address to a physical memory address of the first compressed data.

18. The computer program product of claim 15, wherein the operations further comprise determining a first method of compressing the first compressed data.

19. The computer program product of claim 18, wherein the operations further comprise associating the method of compressing the first compressed data with the second compressed data.

20. The computer program product of claim 15, wherein the first accelerator decompresses the compressed data using one of the following methods: fixed Huffman table decoding, and dynamic Huffman table decoding with full flush mode.

* * * * *